United States Patent [19]
Matsuse et al.

[11] Patent Number: 5,997,651
[45] Date of Patent: Dec. 7, 1999

[54] HEAT TREATMENT APPARATUS

[75] Inventors: Kimihiro Matsuse, Tama; Tsuyoshi Hashimoto, Kofu; Mitsuhiro Tachibana, Yamanashi-ken, all of Japan

[73] Assignee: Tokyo Electron Limited, Tokyo, Japan

[21] Appl. No.: 08/729,287

[22] Filed: Oct. 10, 1996

[30] Foreign Application Priority Data

Oct. 18, 1995 [JP] Japan ................................. 7-294872

[51] Int. Cl.⁶ ................................................. C23C 16/00
[52] U.S. Cl. ...................... 118/725; 118/715; 118/728; 118/729
[58] Field of Search .................. 118/725, 715, 118/728, 729

[56] References Cited

U.S. PATENT DOCUMENTS

| | | | |
|---|---|---|---|
| 5,292,554 | 3/1994 | Sinha | 118/725 |
| 5,304,248 | 4/1994 | Cheng et al. | |
| 5,574,247 | 11/1996 | Nishitani | 118/715 |
| 5,635,244 | 6/1997 | Maeda | 118/715 |
| 5,711,815 | 1/1998 | Lee | 118/725 |

FOREIGN PATENT DOCUMENTS

| | | |
|---|---|---|
| 61-289623 | 12/1986 | Japan . |
| 4-124820 | 4/1992 | Japan . |
| 6-120145 | 4/1994 | Japan . |

*Primary Examiner*—Richard Bueker
*Attorney, Agent, or Firm*—Oblon, Spivak, McClelland, Maier & Neustadt, P.C.

[57] ABSTRACT

A heat treatment apparatus includes a treatment container having a reaction chamber, and a gas chamber a mount table provided in the treatment container for mounting thereon a wafer such that an upper surface of the wafer is exposed to the reaction chamber, and an annular clamp member provided in the reaction chamber, movable between a clamp position in which it contacts the peripheral edge of the wafer in circular line contact and a waiting position in which it is separated from the wafer. The line contact prevents leakage of the process gas from the reaction chamber through a clearance between the clamp member and the wafer.

17 Claims, 5 Drawing Sheets

HEAT TREATMENT APPARATUS

BACKGROUND OF THE INVENTION

1. Field of the Invention

This invention relates to a heat treatment apparatus for forming a film on a treatment object such as a semiconductor wafer.

2. Description of the Related Art

In general, in a process for manufacturing a semiconductor integrated circuit, a metal, such as W (tungsten), WSi (tungsten silicide), Ti (titanium), TiN (titanium nitride), TiSi (titanium silicide), an alloy thereof, or a compound thereof is deposited on a wafer, thereby forming a thin film thereon.

As an apparatus for forming such a thin film, a heat treatment apparatus 2 with heating lamps, as shown in FIG. 11, is used. The heat treatment apparatus 2 has a cylindrical treatment container 4 made of aluminum, etc., and a thin mount table 8 contained in the container 4 and made of e.g. carbon material or an aluminum compound. The mount table 8 is supported, separated from the bottom wall of the container 4, by a support member 7 which has a cylindrical base and three support arms upwardly extending at regular intervals from the upper surface of the base. A transparent window 10 made of quartz is provided below the table 8 such that it closes an opening formed in the bottom wall of the container 4. A sub-box is attached to the bottom wall of the container 4 around the opening, in which heating means 12 or lamps are provided to be rotatable in a direction indicated by the arrow.

At the time of forming a film, the interior of the treatment container 4 is kept airtight, and the heating means 12 is lighted. Heat rays from the heating means 12 are transmitted to the mount table 8 through the transparent window 10, whereby a semiconductor wafer W mounted on the mount table 8 is indirectly heated to and kept at a predetermined temperature. During heating, a process gas, e.g. $WF_6$, and a reduction gas, e.g. $H_2$, are uniformly applied above the surface of the wafer from a shower head 14 provided above the mount table 8, thereby forming on the wafer a metallic thin film of tungsten, etc. To prevent the process gas from flowing into the space defined below the mount table 8, i.e. within the support member 7, and forming an opaque film on the under side of the table 8 and on the transparent window 10, there is provided a gas introducing pipe 11 for introducing, into the space, a backside gas consisting of an inactive gas such as Ar gas or $N_2$ gas. Thus, undesirable flowing of the process gas to an outer peripheral portion or an under surface portion of the wafer is avoided. (See Jpn. Pat. Appln. KOKAI Publications Nos. 4-124820 and 6-120145)

When in a semiconductor integrated circuit having, for example, an MOSFET structure, an electrode or a wire made of aluminum or tungsten is formed directly on an electrode-forming portion of an Si substrate by CVD, it is possible that the material of the electrode or wire will absorb Si from the substrate to make Si deposit on the electrode, or that tungsten atoms will enter the Si wafer, thereby increasing the contact resistance of the electrode-forming portion. To restrain the absorption of Si or the entrance of tungsten, a barrier metal film, which shows high stability to heat, etc., is interposed between the electrode and the electrode-forming portion of the substrate. Depending upon the kinds of the materials of the electrode and the electrode-forming portion, the material of the barrier metal film is selected from high-fusion metals such as Ti, W and Mo, silicide of the metals, and TiN. Further, the barrier metal film is formed by sputtering.

In the case shown in FIG. 12, a TiN barrier metal film 16 is formed on the silicon wafer W, and a tungsten film 18 serving as a wire or electrode is formed on the barrier metal film 16. The barrier metal film 16 prevents separation of Si into the electrode.

As aforementioned, the barrier metal film or TiN film 16 is generally formed by sputtering, while the tungsten film 18 is generally formed by CVD using the heat treatment apparatus described referring to FIG. 11.

Since in the sputtering method, the direction in which a film is formed is highly controlled, the edge of the TiN thin film 16 formed by sputtering can be accurately aligned with the edge of the wafer W. On the other hand, in the CVD method, any step will inevitably be covered. Therefore, the process gas will reach even an under surface portion of the wafer W, thereby forming the tungsten film 18 which extends even to the under surface portion of the wafer W. Thus, an unnecessary film portion or portions 20 are formed as shown in FIG. 12.

The unnecessary film portion 20 is directly attached to the Si wafer W, with no barrier metal film interposed therebetween. Further, the thickness of the film portion 20 is ununiform and thin. Accordingly, it may easily peel off the wafer. Peeled metal may well raise particles.

Since the wafer W is mounted tightly on the mount table 8, it does not seem that the process gas will undesirably reach the under surface of the wafer. Actually, however, a slight clearance is defined therebetween. In the case of the tungsten film formed by CVD, it can sufficiently cover even a fine hole with a diameter of about 0.5 micrometer. This being so, the process gas can easily reach the under surface of the wafer through the slight clearance. If, to prevent it, the flow of the backside gas supplied into the space below the mount table 8 is increased, the backside gas may well enter the reaction chamber above the table 8 to thereby reduce the concentration of the process gas. As a result, the film formed on the wafer will be partially thin, i.e. the inplane uniformity of the resultant film thickness will be degraded. In light of this, the flow of the backside gas cannot be increased.

U.S. Pat. No. 5,304,248 discloses another type film-forming apparatus. In this apparatus, a vertically movable shield ring is provided on the outer periphery of a wafer mount table. When a susceptor is moved to a position in which film-forming is performed, the overall upper surface of a peripheral portion of a wafer placed on the susceptor is clamped by the inner lip of the shield ring. Also in this apparatus, a sufficient sealing effect cannot be obtained, and it is highly possible that the process gas will leak to the under surface of the wafer, thereby forming a film thereon. After careful examination of the cause of the leakage, the following was found: Since a peripheral portion of the wafer is brought into surface contact with the inner lip of the shield ring, the airtightness at the contacting interface between the wafer and the shield ring is microscopically too low to sufficiently prevent leakage of the process gas through the interface. As a result, an unnecessary film will inevitably be formed.

SUMMARY OF THE INVENTION

It is an object of the invention to provide a heat treatment apparatus capable of enoughly preventing undesirable flow of a process gas to the under surface of a treatment object, without degrading the inplane uniformity of the film thickness.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 9 shows a case where film forming is performed using an attachment member with small gas-passing holes; and FIG. 10 shows a case where film forming is performed using an attachment member with no gas-passing holes;

DETAILED DESCRIPTION OF THE PREFERRED EMBODIMENT

A heat treatment apparatus according to one embodiment of the invention will be described in detail with reference to the accompanying drawings.

Figure 1:
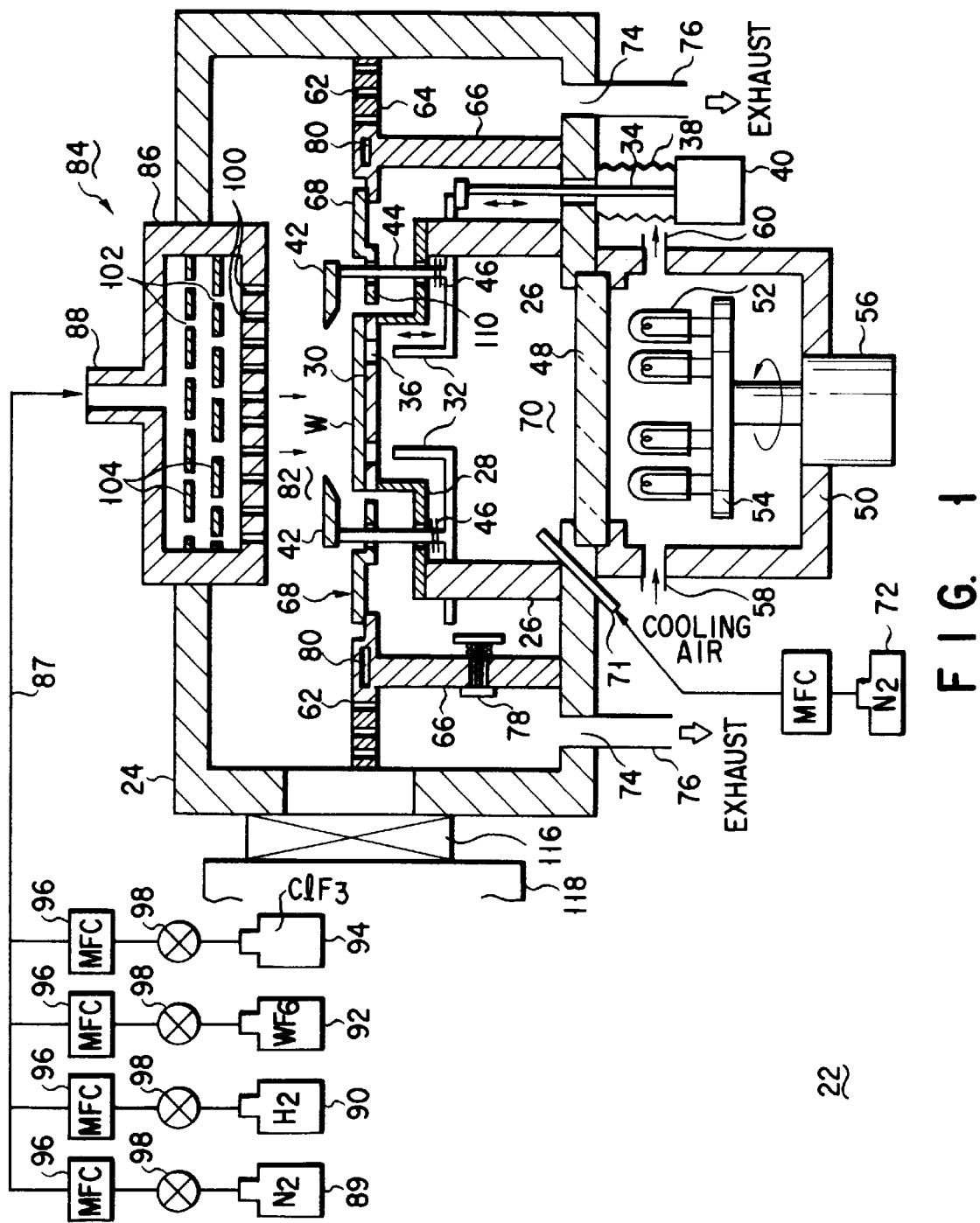
FIG. 1 is a sectional view, showing an embodiment of a heat treatment apparatus according to the invention.
Figure 2:
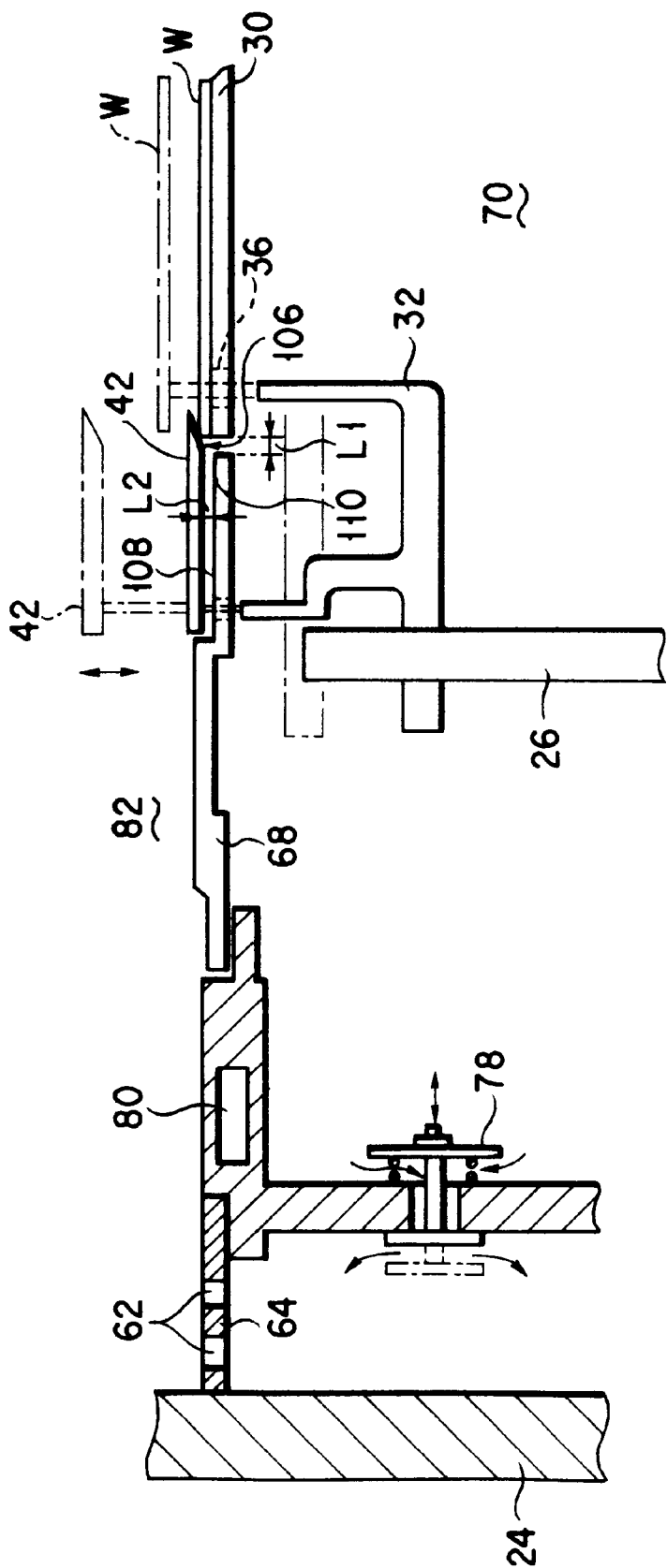
FIG. 2 is an enlarged sectional view, showing a peripheral portion of a mount table shown in FIG. 1.
Figure 3:
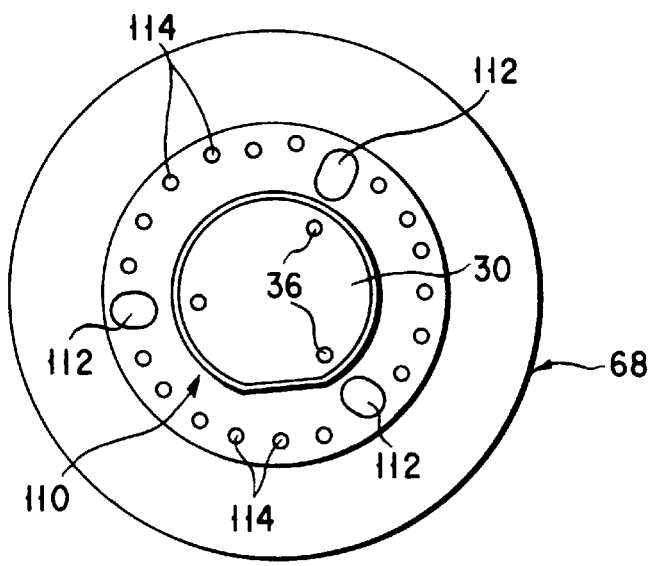
FIG. 3 is a plan view, showing an attachment member incorporated in the apparatus of FIG. 1.
Figure 4:
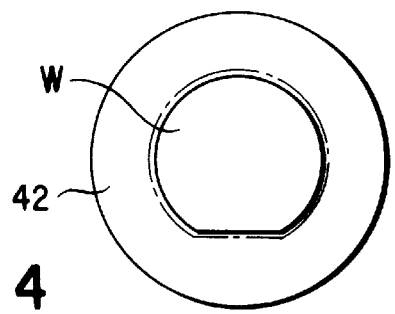
FIG. 4 is a plan view, showing a clamp member incorporated in the apparatus of FIG. 1 for clamping a treatment object.
Figure 5:
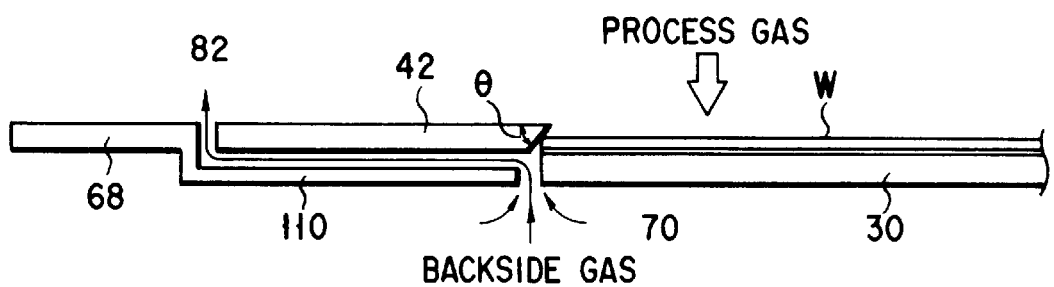
FIG. 5 is a view, useful in explaining a state in which a backside gas flows through a gas purge passage.

FIG. 1 is a sectional view, showing the heat treatment apparatus according to the invention; FIG. 2 is an enlarged sectional view, showing a peripheral portion of a mount table shown in FIG. 1; FIG. 3 is a plan view, showing an attachment member incorporated in the apparatus of FIG. 1; and FIG. 4 is a plan view, showing a support member incorporated in the apparatus of FIG. 1 for supporting a treatment object.

In the embodiment, a one-by-one type film-forming apparatus with heating lamps, which can perform high-speed temperature increase, will be described as an embodiment of the heat treatment apparatus.

A film-forming apparatus 22 of this type comprises a treatment container 24 with an upper wall, a peripheral wall and a bottom wall, which can be hermetically sealed and is preferably cylindrical. The treatment container is made of a metal such as aluminum. A support cylinder 26 with upper and lower openings is coaxially provided in the treatment container 24. The support cylinder 26 has its lower end fixed to the bottom wall of the treatment container 24. A plurality of support members 28 are provided at regular intervals on the upper end of the support cylinder 26. Preferably, three support members 28 are arranged at intervals of about 120°. Each of the support members 28 includes a horizontal arm portion and a vertical arm portion, which is formed integral as one body in the shape of L. The horizontal arm portion has its outer end secured to the upper end of the support cylinder 26, and its inner end horizontally directed toward the radial center of the support cylinder 26. The vertical arm portion vertically and upwardly extends from the inner end of a corresponding horizontal arm portion. The upper ends of the vertical arm portions are secured to peripheral portions of the under surface of a disk-shaped mount table 30, thereby horizontally and concentrically supporting the mount table 30 relative to the support cylinder 26. The diameter of the mount table 30 is set substantially equal to that of a semiconductor wafer W to be placed thereon. The support cylinder 26 and the support members 28 are made of a heat-ray transmissible material such as quartz. The mount table 30 has a thickness of about 1–5 mm, is made of a material with a high heat resistance and a high heat conductivity, such as carbon, an aluminum compound (e.g. aluminum nitride AlN).

A plurality (e.g. three) of L-shaped lifter pins 32 are provided below the mount table 30. The lifter pins 32 are coupled with each other by means of a ring (not shown), and thus simultaneously movable in the vertical direction. Each of the lifter pins 32 has a vertical arm portion, and a horizontal arm portion horizontally extending from the lower end of the vertical arm portion to the outside of the support cylinder 26. To enable the lifter pins 32 to move vertically, vertically extending slots are formed in the support cylinder 26. The horizontal arm portion extends through the corresponding slot. The horizontal arm portion of one of the lifter pins 32 has its outer end connected to the upper end of a driving rod 34, which vertically and downwardly extends to the outside of the treatment container 24 via a hole formed through the bottom wall of the container 24. The driving rod 34 can be vertically moved by an actuator 40 connected to the lower end of the rod. Thus, when the driving rod 34 is upwardly moved, the three lifter pins 32 are also upwardly moved at the same time. As a result, the upper ends of the vertical arm portions of the lifter pins 32 pass lifter pin holes 36 formed through the mount table 30, thereby lifting a wafer W placed on the mount table. On the other hand, when the driving rod 34 is moved down, the wafer supported by the vertical arm portions of the lifter pins 32 is placed on the mount table 30.

A contractible bellows 38 is interposed between the under surface of the bottom wall of the container 24 and the actuator 40. Specifically, the upper and lower ends of the bellows 38 are fixed to the under surface of the bottom wall and the upper surface of the actuator, such that a lower end portion of the driving rod 34 which is outwardly extended from the container 24, is entirely contained in the bellows in an airtight manner.

A clamp ring 42 made of, for example ceramic, which serves as means for fixing a wafer W, i.e. serves as a clamp ring member for clamping the peripheral edge of the wafer from above to secure it to the mount table 30, is provided above a peripheral portion of the mount table 30 concentrically with the same. The clamp ring 42 is fixed to the upper end of each of vertical arms 44, which loosely pass holes formed in the horizontal arm portions of the support members 28 and extend vertically. Preferably, the arms 44 are made of a heat-ray transmissible material such as quartz. The arms 44 have their lower ends coupled with the lifter pins 32. The clamp ring 42 fixed to the lifter pins 32 by means of the arms 44 can be moved vertically in accordance with vertical movement of the lifter pins 32. A compression coil spring 46 is interposed between the lower surface of the horizontal arm portion of the support member 28 and the upper surface of the horizontal arm portion of a corresponding lifter pin 32. The compression coil springs 46 urge the clamp ring 42 downward to secure the clamp of the clamp ring 42. Preferably, these compression coil springs are arranged such that they receive lower portions of the arms 44, respectively. Also preferably, the lifter pins 32 and the support members 28 are made of a heat-ray transmissible material such as quartz.

A circular opening concentric with the mount table 30 is formed in the bottom wall of the container 24 below the mount table 30. A transmission window 48 made of a heat-ray transmissible material such as quartz seals the circular opening in an airtight manner. A box-shaped heat housing 50 is attached to the under surface of the bottom wall to surround the transmission window 48. In the heat housing 50, a plurality of heating lamps 52 such as halogen lamps are attached to the upper surface of a rotary table 54 which serves also as a reflector. The rotary table 54 is rotated about its vertical axis in a direction, indicated by the arrow (FIG. 1), by means of a driving motor 56 attached to the bottom of the heat housing 50. Preferably, the table 54 is located coaxial with the mount table 30. Heat rays emitted from the heating lamps 52 permeate the window 48 and reach the under surface of the mount table 30, thereby heating, by heat conduction through the table 30, a wafer W placed thereon to a predetermined temperature.

A cooling air introducing port 58 for introducing air into the housing 50 to cool the transmission window 48, and a cooling air discharging port 60 for discharging the cooling air are provided in opposed side walls of the housing 50, respectively.

At least one gas nozzle 71 is provided through a bottom wall portion of the container 24 to face a gas chamber 70 defined by the mount table 30 and the support cylinder 26. Through the gas nozzle 71, an inactive gas (such as gas of $N_2$, Ar; in this case $N_2$ gas) from a gas source 72, which serves as a backside gas and whose flow is controlled, is introduced into the gas chamber 70 in order to prevent a process gas from entering the chamber 70, forming a film on the inner surface of the transmission window 48 and making the window opaque to degrade its heat-ray transmissibility.

A horizontal annular gas flow-adjusting plate 64 with multiple adjusting holes 62 is located around the mount table 30 concentric therewith in the vicinity of an inner peripheral portion of the container 24. The adjusting plate 64 is held between the outer periphery of an upper end portion of a cylindrical support column 66 and an inner peripheral portion of the container 24. The lower end of the column 66 is fixed to the bottom wall of the container 24. An annular stepped portion is formed at the inner peripheral side of the upper end portion of the support column 66. An annular attachment member 68 made of quartz has its outer periphery held by the annular stepped portion such that the member 68 is concentrically supported by the support column 66. The attachment member 68 divides the interior of the treatment container 24 into upper and inner chambers to thereby minimize the amount of a process gas entering the lower chamber located below the mount table 30. A water-cooling jacket 80 is provided in the upper end portion of the support column 66 for mainly cooling the side of the gas flow-adjusting plate 64 with cooled water circulating therethrough. A plurality of exhaust ports 74 are formed at circumferentially regular intervals through bottom wall portions of the container 24 below the gas flow-adjusting plate 64. The exhaust ports 74 are connected to exhaust pipes 76, which are connected to a vacuum pump (not shown). The container 24 can be exhausted to a predetermined vacuum value (e.g. $100-10^{-6}$ Torr).

At least one pressure release valve 78 which is operative with a pressure difference, for example, of about 0.1 kg/cm$^2$ is provided in the support column 66. The valve 78 is opened when the pressure in the gas chamber 70 below the mount table 30 excessively increases, thereby discharging the extra backside gas through a space defined between the support column and the inner peripheral surface of the container, and through the discharge ports. As a result, the pressure in the chamber 70 is prevented from increasing to an excessively positive value.

A gas supply unit 84 for introducing, into the upper chamber, i.e. a reactive chamber 82, gases necessary to the overall process, such as a process gas, a cleaning gas, etc. is provided in that upper wall portion of the container 24 which is opposed to the mount table 30. The gas supply unit 84 has a shower head structure, made of aluminum, etc. The unit 84 comprises a head main body 86 provided in an upper wall portion of the container 24. The head main body 86 has a gas introducing port 88 provided at a center portion of the upper wall thereof, which projects from the upper wall of the container 24.

Gas sources 89, 90 and 92 for supplying $N_2$, $H_2$ and $WF_6$, respectively, and a leaning gas source 94 for supplying $ClF_3$ are connected to the gas introducing port 88 through a gas line 87 and a plurality of branch lines, respectively. A flow control valve 96 and an opening/closing valve 98 are provided for each branch line.

A great number of gas holes 100 for discharging gases received in the head main body 86 are arranged uniformly in that horizontal lower wall of the head main body 86, which is opposed to the mount table 30 and parallel thereto. Through the gas holes, gases are uniformly applied into the reactive chamber 82. Further, the head main body 86 contains upper and lower diffusion plates 104 each having a great number of gas diffusion holes 102. By virtue of these plates, gases can be more uniformly applied to the chamber.

Referring then to FIGS. 2–5, the structures of the clamp ring 42 and the attachment member 68 will be described in more detail.

As is clearly shown in FIG. 4, the clamp ring 42 has a center opening which is substantially similar to the outline of a wafer W, thus showing a generally circular configuration. The overall width of the ring 42 is set such that an inner peripheral portion of the ring 42 overlaps a peripheral portion of a wafer by a slight light or width (0.5–1.5 mm). Preferably, the center opening of the clamp ring 42 is not completely circular, but includes a linear portion corresponding to the orientation flat of the wafer (as shown in FIG. 4). In other words, it is preferable that the configuration of the center opening is similar to the outline of the wafer. As is shown in FIG. 2, the overall inner edge portion of the clamp ring 42 is tapered such that the width of the upper surface of the ring is greater than that of the under surface, thereby forming a tapered inner edge surface 106. The tapered inner edge surface 106 is pressed against the upper peripheral edge of a wafer at the time of treating the wafer. Since the clamp ring 42 is thus brought into line contact with the upper peripheral edge of the wafer, they can contact each other more tightly or more airtightly than in the case where they are brought into surface contact with each other. As a result, a process gas applied to the upper surface of the wafer can be prevented from leaking to the under surface of the wafer through the clamp ring and the wafer. In order to make the best use of the wafer-clamping function of the clamp ring 42 with the airtightness therebetween maintained, it is preferable to set the inclination angle θ of the tapered inner edge surface 106 to about 5–15°, optimally to about 10°. The pressure of contact, i.e. the clamping pressure, is preferably set to 0.1–0.2 kg/cm$^2$.

Considering that the clamp ring 42 is brought into direct contact with the edge of the wafer W, the ring 42 is made of the same opaque material as the mount table 30, which does not pass heat rays, i.e. AlN ceramic, etc. Thus, the clamp ring 42 can be heated like the mount table 30, and hence no sharp temperature gradient will occur between the ring 42 and the wafer W.

Although the clamp ring and the wafer contact each other in a highly airtight manner, it may be still possible that a small amount of a process gas will leak to the reverse surface of the wafer therethrough. In light of this, in the embodiment of the invention, a gas purge passage 108 is defined between the clamp ring 42 and the attachment member 68 located below the ring 42 when the clamp ring 42 holds the wafer (see FIG. 2), in order to completely expel the process gas having leaked through a clearance defined between the tapered inner edge surface 106 and the wafer, before it sticks to the wafer and/or the elements contained in the chamber.

The annular attachment member 68 comprises a radially inner portion, a radially middle portion, and a radially outer portion supported by the support column 66. The upper surface of the radially inner portion, on which the clamp ring 42 is to be substantially superposed with a predetermined distance defined therebetween, is located at a level lower than the upper surface of the middle portion by (the thickness of the clamp ring 42+α(=L2)). The clamp ring 42 can be vertically moved by the lifter pins 32 as aforementioned, between a raised position (waiting position) indicated by the dotted line in FIG. 2 and a lowered position (clamping position) indicated by the solid line. In the lowered position, the clamp ring 42 is slightly separated (by a distance L2) from the lowered horizontal surface 110 of the radially inner portion of the attachment member 68, thereby to define the gas purge passage 108. Further, in the lowered position, the clamp ring 42 is set such that its upper surface is positioned, as far as possible, at substantially the same level as the upper surface of the middle portion of the attachment member 68, and also as the wafer placed on the mount table. In other words, the upper surfaces of the clamp ring 42, the middle portion of the attachment member 68 and the wafer are set, so that no turbulence of a process gas will occur above the upper surfaces exposed to the reaction chamber 82. The inner periphery of the attachment member 68 is separated by a distance L1 from the outer periphery of the mount table 30 to define an annular gas inlet therebetween. The inner diameter of the attachment member 68 and the outer diameter of the mount table 30 are set such that the distance L1 is preferably 0.5–1.5 mm, and optimally about 1.0 mm. The light (L2) of the gas purge passage is preferably 0.3–1.0 mm, and optimally about 0.8 mm. The inner end surface of the middle portion of the attachment member 68 is slightly separated from the outer periphery of the clamp ring 42 to thereby define an annular gas outlet. The distance therebetween is slightly longer than the distance L1.

Thus, the gas purge passage 108 having the annular gas inlet defined between the attachment member 68 and the mount table 30 and opening downward, and the annular gas outlet defined between the middle portion of the attachment member 68 and the clamp ring 42 is formed between the attachment member 68 and the clamp ring 42. Since the gas purge passage 108 of a small eight is formed in the shape of a ring along the overall under surface of the clamp ring 42, a backside gas introduced into the gas chamber 70 below the mount table 30 purges the leaked process gas having flown downward through a clearance between the tapered inner edge surface 106 and the wafer, while it flows into the reaction chamber 82 through the gas purge passage 108.

As is shown in FIG. 3, the radially inner portion of the attachment member 68 has three large holes 112 for receiving the ring arms 44 of the clamp ring 42, and a plurality of small gas leak holes 114 arranged circumferentially. When the pressure in the lower chamber 70 exceeds a predetermined positive value, the backside gas contained in the chamber 70 will leak into the upper chamber of the treatment container 24 through the holes 112 and 114 and the gas purge passage 108, thereby preventing the pressure in the chamber 70 from excessive increase.

Since as aforementioned, the clamp ring 42 is preferably heated. It is desirable to make the attachment member 68 of a transparent material which can pass heat rays, e.g. quartz.

In FIG. 1, reference numeral 118 denotes a load lock chamber connected to the heat treatment apparatus through a gate valve 116.

The film-forming treatment performed by the above-described apparatus will now be described. In an example stated below, a tungsten film will be formed, by CVD, on a TiN barrier metal layer provided on an Si semiconductor wafer by sputtering.

First, a wafer W with the TiN barrier metal layer loaded in the load lock chamber 118 is transferred by a transfer arm (not shown) through the gate valve 116 into the treatment container 24 which is beforehand set under vacuum pressure. The wafer W is transferred from the transfer arm onto the lifter pins 32 situated in their raised positions. The lifter pins 32 are then lowered by lowering the driving rod 34, thereby mounting the wafer W on the mount table 30. When the driving rod 34 has been lowered, the tapered inner edge surface 106 of the clamp ring 42 tightly contacts the upper peripheral edge of the wafer W. Thus, the wafer W is clamped between the clamp ring 42 and the mount table 30.

Then, the pressure in the treatment container 24 is reduced to a predetermined vacuum value, and the heating lamps 52 are lighted and rotated in the heat housing 50. Heat rays emitted from the heating lamps pass the transmission window 48 and heat the under surface of the mount table 30. Since the mount table 30 has a very thin thickness of about 1 mm, it is heated very quickly. Accordingly, the wafer W placed on the table 30 is quickly heated to a predetermined temperature by heat conduction.

When the wafer W is heated to a process temperature, e.g. about 400°, $N_2$ gas as a carrier gas, $WF_6$ gas as a process gas, and $H_2$ gas as a reduction gas are supplied from the gas sources 89, 90 and 92 into the reaction chamber 82 of the treatment container 24, respectively. The flows of $H_2$ gas and $WF_6$ gas are about 750SCCM and about 80SCCM, respectively. Ar or He gas may be used as the carrier gas in place of $N_2$ gas. The supplied gas mixture will cause predetermined chemical reaction, thereby forming a tungsten film on the TiN film. The film forming treatment is continued until the tungsten film grows to have a predetermined thickness.

While the film-forming treatment is performed, $N_2$ gas is supplied as the backside gas from an $N_2$ gas source 72 to set the pressure of the lower chamber 70 to a value slightly higher than the pressure of the upper reaction chamber 82, in order to prevent the process gas from reaching the under surface of the wafer W and the lower chamber 70 through a clearance between the clamp ring 42 and the wafer W. However, it is rather difficult to control the pressure values in the chambers 70 and 82. Moreover, the process gas such as $WF_6$ gas can easily pass a fine clearance. For example, the process gas can easily enter a fine clearance between the under surface of the wafer W and the mount table 30, and the chamber 70 below the mount table 30, through a fine clearance between the clamp ring 42 and the edge of the wafer.

To avoid the above, the tapered inner edge surface 106 is formed as the inner periphery of the clamp ring 42. The tapered inner edge surface 106 is brought into line contact with the upper edge of the wafer to press the wafer against the mount table 30. By virtue of the line contact, the tightness or airtightness between the clamp ring 42 and the wafer is greater than in the conventional case which employs surface contact therebetween. Accordingly, downward flow of the process gas is highly restrained. If in this case, the pressure in the lower chamber 70 is controlled to be higher than the pressure in the upper reaction chamber 82, upward pressure is applied to the overall under surface of the wafer, with the result that the tightness or airtightness between the edge of the wafer and the downwardly urged tapered inner edge surface 106 of the clamp ring 42 is increased.

To more increase the airtightness, it is considered to increase the constant of the coil spring 46 which downwardly urges the clamp ring 42. In this case, however, forces are concentrically applied to portions (e.g. three portions) of a wafer corresponding to the portions of the clamp ring 42 connected thereto, and therefore it is possible that the clamp ring itself will be deformed and the airtightness will be degraded. In light of this, to increase the spring constant is not preferable.

As described above, the structure using the tapered inner edge surface 106 for increasing the airtightness can prevent entrance of the process gas and hence forming of a film or a deposition on the under surface of the mount table 30 or on the inner surface of the transmission window 48, and also can prevent the process gas from reaching the edge of the wafer and a peripheral portion of the under surface of the same, and forming a film thereon.

However, it is still possible, irrespective of the highly airtight tapered inner edge surface 106, that there is a fine clearance between the tapered inner edge surface 106 and the wafer because, for example, of a slightly uneven edge surface portion of the wafer and/or a rough portion of the tapered inner edge surface 106. In such a case, the process gas may well leak downward through the fine clearance.

Considering the above leakage, the embodiment of the invention employs the gas purge passage 108 of the fine highs (width) L2, which is defined between the under surface of the clamp ring 42 and the upper surface 110 of the stepped radially inner portion of the attachment member 68 when the clamp ring 42 is in its clamp position. The process gas having flown downward through the fine clearance is surely purged in the manner stated below before it sticks to peripheral elements. As is shown in FIGS. 2–5, the backside gas supplied into the chamber 70 below the mount table 30 is introduced into the gas purge passage 108 through the gas inlet of the width L1, flows through the passage 108 as indicated by the arrow in FIG. 5, and then enters the reaction chamber 82 through the gas outlet defined between the outer periphery of the clamp ring 42 and the inner periphery of the middle portion of the attachment member 68. Thus, even if the process gas flows downward through a fine clearance defined between the tapered inner edge surface 106 and the edge of the wafer, it is returned to the reaction chamber 82 through the gas purge passage 108 by the backside gas flowing through the passage 108 into the reaction chamber 82.

As a result, the process gas can reliably be prevented from reaching the edge of the wafer and a peripheral portion of the under surface of the wafer, and forming a film thereon, in addition to the aforementioned advantage that a film can reliably be prevented from sticking to the mount table 30 or the inner surface of the transmission window 48.

In the embodiment, the upper surface of the clamp ring 42 is positioned at substantially the same level of the upper surface of the wafer when the ring 42 is in its lowered or clamping position, thereby preventing turbulence of the process gas to obtain the inplane uniformity of the film thickness. Since, however, this is not the main object of the invention, the upper surfaces of the ring 42 and the wafer may not necessarily be positioned at the same level. For example, it may be modified such that the upper surface of the radially inner portion of the attachment member 68 is set at the same level as that of the radially middle portion of the member 68, and that the clamp ring 42 is positioned above the radially inner portion, i.e. the upper surface of the ring 42 is set higher than that of the wafer.

Moreover, since the gas outlet of the gas purge passage 108 is outwardly separated from the wafer by a distance substantially corresponding to the radial width of the clamp ring 42, the process gas discharged through the gas outlet can be prevented from adversely influencing the inplane uniformity of the thickness of a film formed on the wafer.

In addition, the radially inner portion of the attachment member 68 has the gas leak holes 114 as shown in FIG. 3. Since that part of the backside gas which passes the gas leak holes 114 is discharged via the gas purge passage 108, the chamber 70 below the mount table 30 is prevented from being excessively pressurized. Further, the pressure release valve 78 is provided in the support column 66 for securing the safety of the heat treatment apparatus. When the pressure in the chamber 70 is excessively high, the pressure release valve 78 is opened against the urging force of the spring dedicated thereto, thereby releasing the pressure therethrough. As a result, relatively-thin internal structural element such as the attachment member 68 or the mount table 30 can be prevented from breakage.

Figure 6:
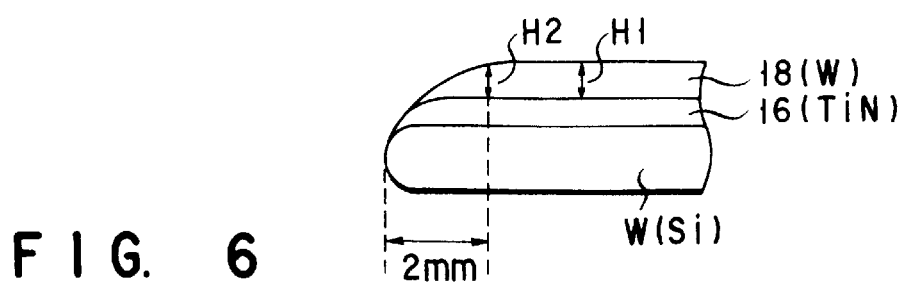
FIG. 6 is an enlarged view, useful in explaining film-forming performed using the apparatus of the invention.
Figure 12:
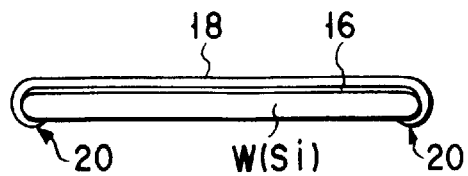
FIG. 12 is a view, useful in explaining a film-formed state assumed when film forming is performed by the apparatus shown in FIG. 11.

After performing CVD film forming, with downward flow of the process gas through a clearance between the clamp ring 42 and the wafer prevented, an excellent tungsten film 18 as shown in FIG. 6 could be obtained. Differing from the conventional case shown in FIG. 12, the tungsten film 18 does not extend even to the surface of the edge of the wafer or to peripheral part of the reverse surface of the same, but extends only on the TiN barrier metal film 16. Accordingly, it is not possible that part of the tungsten film 18 will peel off and raise its particles. Furthermore, the ratio of the thickness H1 of a portion of the tungsten film 18 on the center side, to the thickness H2 of a portion of the same apart from the peripheral edge by 2 mm can be kept at about 0.95 or more. This means that the overall film can have substantially the same thickness.

Figure 7:
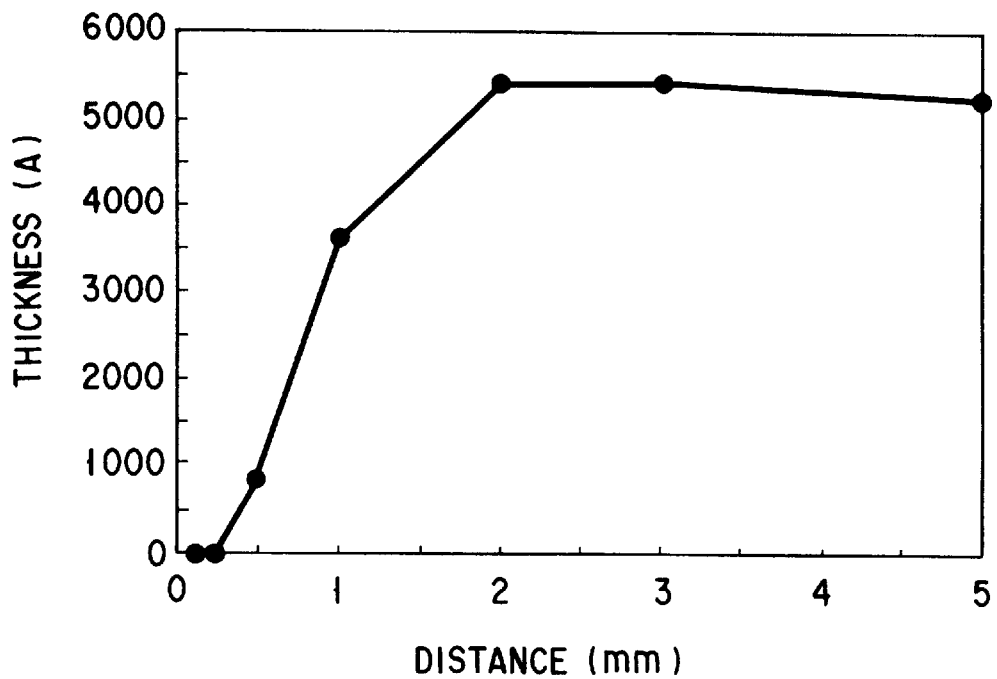
FIG. 7 is a graph, showing the measured thicknesses of those portions of a film which are located between the edge of a wafer and the center thereof.

FIG. 7 shows results of measurements performed to confirm the above effect.

In FIG. 7, the ordinate indicates the thickness of a portion of a tungsten film formed on a wafer, and the abscissa indicates the radial distance between a portion of the wafer and the edge of the same. As is evident from FIG. 7, the thickness is constantly about 5400 Å when the distance is 2 mm or more.

Figure 8:
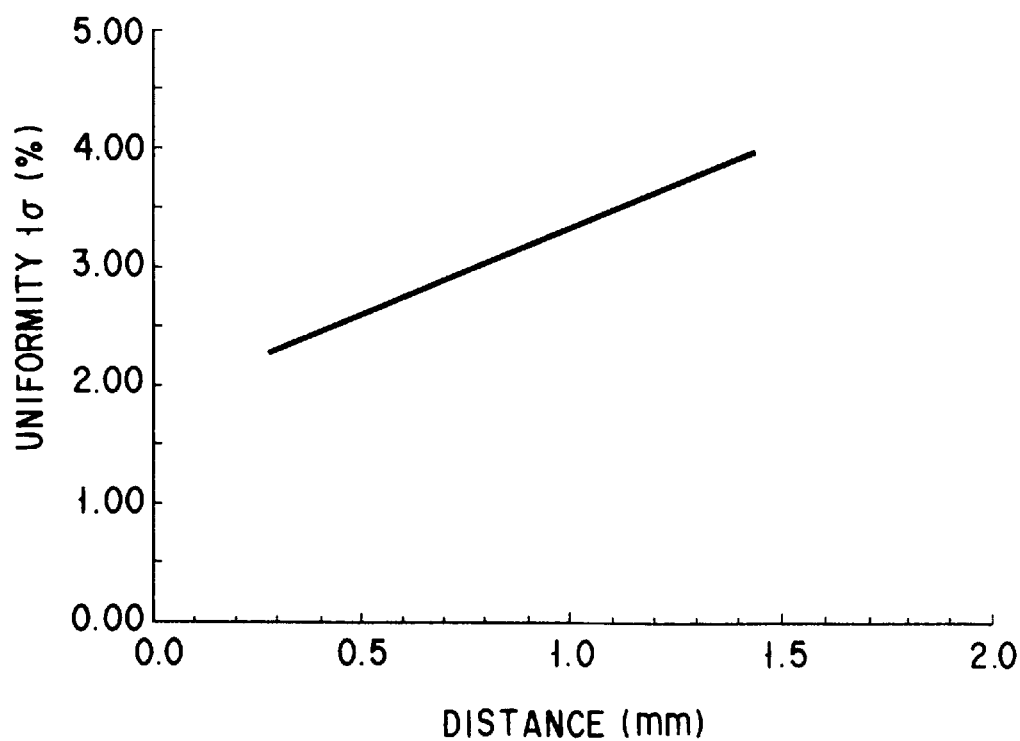
FIG. 8 is a graph, showing the relationship between the uniformity in the thickness of a film and the distance over which the wafer and a clamp ring overlap each other.

In FIG. 8, the ordinate indicates the degree of uniformity in thickness of the tungsten film, and abscissa indicates the radial distance over which the wafer W and the clamp ring 42 overlap each other. As can be understood from FIG. 8, the shorter the distance over which the wafer and the clamp ring 42 overlap each other, the more excellent the uniformity of the thickness of a film formed thereon. Even when the overlapping distance is 1.5 mm, the uniformity is 4%. In light of this, it suffices if the overlapping distance is 1.5 mm or less. However, the case where the overlapping distance is 0.3 mm or less is not preferable in light of variations in sizes of structural components.

Figure 9:
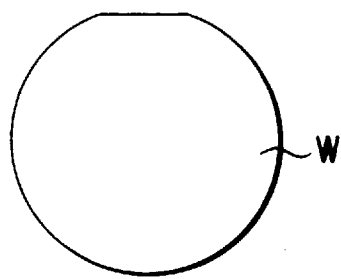
FIGS. 9 and 10 are plan views, showing the under surfaces of wafers obtained after film forming.
Figure 10:
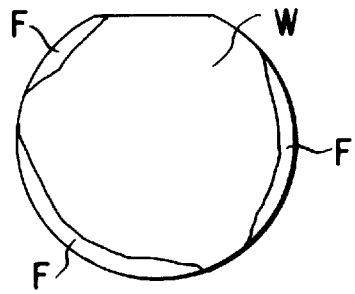
Figure 11:
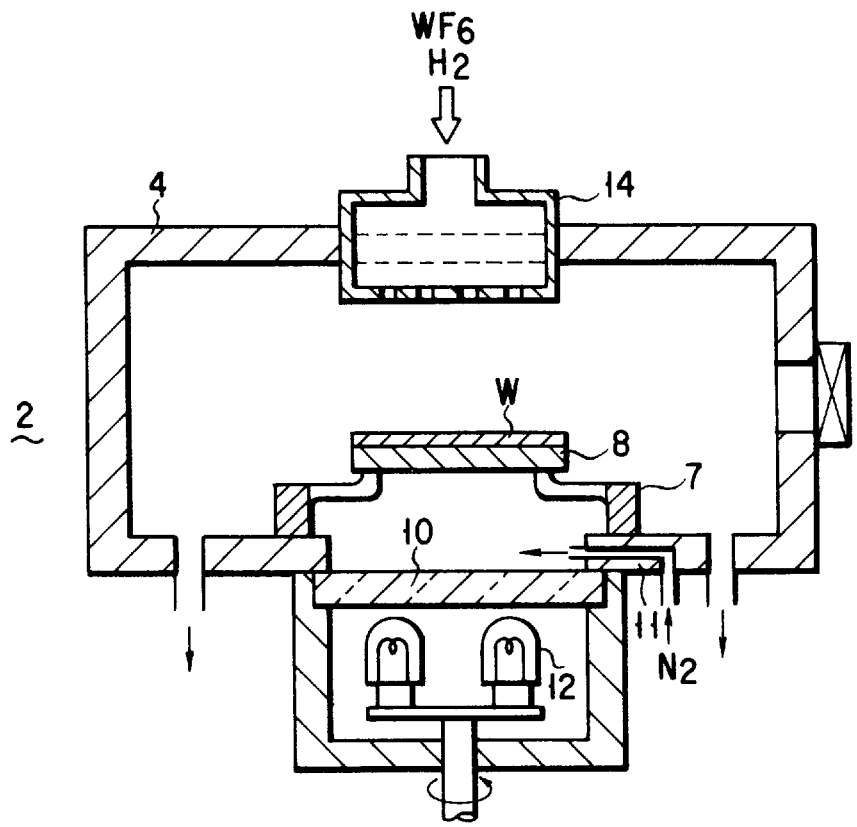
FIG. 11 is a sectional view, showing a conventional heat treatment apparatus with heating lamps.

FIG. 9 shows a state of the under surface of a wafer W, obtained using the attachment member 68 with the small gas leak holes 114 shown in FIG. 3. FIG. 10 shows a state of the under surface of a wafer W, obtained using an attachment member with no such gas leak holes. As is evident from FIGS. 9 and 10, no tungsten film is formed on the reverse surface in the FIG. 9 case, whereas films F are formed on peripheral portions of the reserve surface in the FIG. 10 case. In the FIGS. 9 and 10 experiments, the flow of the backside gas was 1000 sccm, and the height L2 of the gas purge passage 108 was 0.8 mm.

Although the embodiment employs both the tapered inner edge surface 106 and the gas purge passage 108 in order to make the best use of the function for preventing downward leakage of the process gas, it is a matter of course to employ one of them in one heat treatment apparatus.

Moreover, although in the embodiment, the mount table 30 is supported by the three L-shaped support members 28, the invention is not limited to this. For example, the apparatus may be modified such that three linear rods used as the support members are penetrated through the surface of the mount table 30 at regular intervals to support the table.

Although in the embodiment, the opening of the clamp ring 42 is formed substantially circular so as to conform the opening to the outline of the wafer, the configuration of the opening may be modified in accordance with that of a treatment object.

In the embodiment, the manner of providing, by CVD, a tungsten film on the TiN barrier metal film formed by sputtering was described. However, the material of the barrier metal film is not limited to TiN, but may be Ti, W or Mo silicide, or W or Mo nitride. Further, an aluminum film may be formed instead of the tungsten film.

The apparatus of the invention is also applicable to a process other than the process for forming a film on the barrier metal film.

Moreover, although the embodiment employs the mount table for supporting a wafer thereon, any other support means may be used instead of the mount table. The support means is not limited to that supports the object horizontally, but may be support means for supporting the object vertically. In this case, it is necessary to change the arrangement of the reaction chamber and the (backside) gas chamber.

In summary, the heat treatment apparatus of the invention can provide the following advantages:

An annular clamp member for clamping a treatment object is brought into circular line contact with a treatment object, and preferably a tapered surface is formed at the overall inner edge portion of the clamp member for tightly holding the edge of the treatment object. Therefore, the clamp member and the treatment object can contact each other in a highly airtight manner, with the result that a process gas can be prevented from undesirably flowing to an edge portion or a under surface portion of a treatment object, and accordingly forming of an unnecessary film or films thereon can be prevented without degrading the inplane uniformity of the film thickness.

Thus, the heat treatment apparatus of the invention is especially useful to prevent forming of an unnecessary film on an edge portion or an under surface portion of a treatment object in the case, for example, of forming a film on a barrier metal film, thereby to prevent occurrence of particles as a result of peeling of the unnecessary film or films.

Moreover, the process gas leaking through a clearance between the clamp member and the treatment object which contact each other is exhausted via the gas purge passage defined below the clamp member. Also in this case, the same advantage as obtained using the tapered inner edge surface of the clamp member can be obtained.

In particular, where both the tapered inner edge surface and the gas purge passage are employed, the above-described advantage can be still more secured.

In addition, the gas leak holes formed in the attachment member and/or the pressure release valve can prevent excessive pressurizing of the chamber located below the mount table, and accordingly prevent breakage of structural elements contained in the chamber.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A heat treatment apparatus comprising:
    a treatment container having a reaction chamber to be supplied with a process gas, and a gas chamber to be supplied with a backside gas;
    support means provided in the treatment container for supporting the treatment object such that one surface of the treatment object is exposed to the reaction chamber;
    a ring-like clamp member provided in the reaction chamber, movable between a clamp position in which it contacts the treatment object and a waiting position in which it is separated from the treatment object, and having an inner edge portion defining an opening through which the one surface of the treatment object is to be exposed, the clamp member having seal means to be brought into linear contact with the outer periphery of the treatment object when it is in the clamp position, to thereby prevent leakage of the process gas from the reaction chamber through a clearance between the clamp member and the treatment object;
    driving means for selectively moving the clamp member between the clamp position and the waiting position;
    means for supplying the process gas into the reaction chamber;
    means for supplying the backside gas into the gas chamber; and
    means for heating the treatment object, wherein substantially the entire inner edge portion of the clamp member tapers to form a beveled surface configured to be brought into linear contact with an outer edge of the treatment object, to thereby prevent leakage of the process gas from the reaction chamber through a clearance between the clamp member and the treatment object.

2. The heat treatment apparatus according to claim 1, wherein the entire inner edge portion of the clamp member tapers to form the beveled surface.

3. The heat treatment apparatus according to claim 1, wherein the means for supplying the backside gas has at least one nozzle for supplying the backside gas into the gas chamber such that the pressure in the gas chamber exceeds the pressure in the reaction chamber.

4. The heat treatment apparatus according to claim 3, further comprising means for releasing part of the backside gas in the gas chamber when the pressure in the gas chamber exceeds a predetermined value.

5. The heat treatment apparatus according to claim 1, wherein the driving means has mount/dismount means for mounting and dismounting the treatment object on and from the support means, and means for simultaneously moving the mount/dismount means and the clamp member.

6. The heat treatment apparatus according to claim 1, wherein the support means has a mount table provided in the gas chamber for mounting thereon the treatment object, and means for fixing the mount table to the treatment container.

7. The heat treatment apparatus according to claim 6, further comprising gas purge means for purging the backside gas into the reaction chamber along an outer edge portion of the mount table.

8. The heat treatment apparatus according to claim 1, wherein the tapered inner edge portion has a taper angle of 5–15°.

9. The heat treatment apparatus according to claim 1, wherein the tapered inner edge portion of the clamp member circumferentially overlaps the one surface of the treatment object by a radial distance of 0.3–1.5 mm when the clamp member is in the clamp position.

10. A heat treatment apparatus comprising:
a treatment container having a reaction chamber to be supplied with a process gas, and a gas chamber to be supplied with a backside gas;
partition means provided between the reaction chamber and the gas chamber and partitioning them;
a ring-like clamp member provided in the reaction chamber, movable between a clamp position in which it contacts and clamps the treatment object and a waiting position in which it is separated from the treatment object, and having an inner edge portion defining an opening through which one surface of the treatment object is to be exposed;
support means provided in the treatment container for supporting the treatment object such that one surface of the treatment object is exposed to the reaction chamber;
means for supplying the process gas into the reaction chamber;
means for supplying the backside gas into the gas chamber to cause the pressure in the gas chamber to be higher than the pressure in the reaction chamber; and
means for heating the treatment object;
the partition means including a member for cooperating with the clamp member and that portion of the treatment object which contacts the clamp member, when the clamp member is in the clamp position, to define a gas purge passage which has an inlet communicating with the gas chamber and an outlet communicating with the reaction chamber, so that part of the backside gas is guided from the inlet to the outlet through the gas purge passage and returns into the reaction chamber, and part of the process gas which has leaked from the reaction chamber into the gas purge passage through a clearance between the clamp member and the treatment object,
wherein substantially the entire inner edge portion of the clamp member tapers to form a beveled surface configured to be brought into linear contact with an outer edge of the treatment object, to thereby prevent leakage of the process gas from the reaction chamber through a clearance between the clamp member and the treatment object.

11. The heat treatment apparatus according to claim 10, wherein the clamp member and the partition means have respective flat surfaces to be opposed to each other with a predetermined distance interposed therebetween, thereby to define the gas purge passage, and the partition means comprises an annular attachment member having a radially inner portion with the flat surface.

12. The heat treatment apparatus according to claim 11, wherein the gas purge passage has a width of 0.3–1.0 mm, and the inlet of the gas purge passage has a width of 0.5–1.5 mm.

13. The heat treatment apparatus according to claim 11, wherein the radially inner portion of the attachment member has a plurality of gas leak holes communicating with both the gas chamber and the gas purge passage for permitting the backside gas in the gas chamber to enter the gas purge passage therethrough.

14. The heat treatment apparatus according to claim 11, wherein the clamp member has a surface other than the flat surface, the surface other than the flat surface being positioned at substantially the same level as the one surface of the treatment object when the clamp member is in the clamp position.

15. The heat treatment apparatus according to claim 10, wherein the entire inner edge portion of the clamp member tapers to form the beveled surface.

16. A heat treatment apparatus comprising:
a treatment container having a reaction chamber to be supplied with a process gas, and a gas chamber to be supplied with a backside gas;
a mount table provided in the treatment container for mounting thereon a wafer such that one surface of the wafer is exposed to the reaction chamber;
a clamp member provided in the reaction chamber, movable between a clamp position in which it contacts the wafer and a waiting position in which it is separated from the wafer, and having an inner edge portion defining an opening through which the one surface of the wafer is to be exposed, the shape of the inner edge portion being similar to the outline of the wafer and having a diameter smaller than that of the wafer, the clamp member having seal means to be brought into linear contact with the outer edge of the wafer when it is in the clamp position, to thereby prevent leakage of the process gas from the reaction chamber through a clearance between the clamp member and the wafer;
means for supplying into the reaction chamber the process gas which includes a material gas for forming a film on the one surface of the wafer;
means for supplying the backside gas into the gas chamber;

a member for cooperating with the clamp member and the wafer when the clamp member is in the clamp position, to define a gas inlet communicating with the gas chamber and a gas purge passage; and means for heating the wafer and causing the process gas to react in the reaction chamber so as to form a film on the one surface of the wafers, wherein substantially the entire inner edge portion of the clamp member tapers to form a beveled surface configured to be brought into linear contact with an outer edge of the treatment object, to thereby prevent leakage of the process gas from the reaction chamber through a clearance between the clamp member and the treatment object.

17. The heat treatment apparatus according to claim 16, wherein the entire inner edge portion of the clamp member tapers to form the beveled surface.

* * * * *